United States Patent
Chang et al.

(10) Patent No.: US 10,627,728 B2
(45) Date of Patent: Apr. 21, 2020

(54) METHOD FOR CREATING VACUUM IN LOAD LOCK CHAMBER

(71) Applicant: Taiwan Semiconductor Manufacturing Co., Ltd., Hsinchu (TW)

(72) Inventors: Tung-Jung Chang, Hsinchu County (TW); Yu-Fu Lin, Hsinchu (TW); Sheng-Kang Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 111 days.

(21) Appl. No.: 15/622,483

(22) Filed: Jun. 14, 2017

(65) Prior Publication Data

US 2018/0364596 A1 Dec. 20, 2018

(51) Int. Cl.
*G03B 27/52* (2006.01)
*G03F 7/20* (2006.01)
*H01L 21/67* (2006.01)

(52) U.S. Cl.
CPC ...... *G03F 7/70841* (2013.01); *G03F 7/70808* (2013.01); *G03F 7/70908* (2013.01); *G03F 7/70991* (2013.01); *H01L 21/67201* (2013.01); *G03F 7/7075* (2013.01)

(58) Field of Classification Search
CPC ........... H01L 21/67201; C23C 16/4412; G03F 7/70841; G03F 7/708; G03F 7/70808; G03F 7/70858; G03F 7/70908; G03F 7/70933; G03F 7/70991; G03F 7/70866; G03F 7/70883; G03F 7/70916; G03F 7/70925; G03F 7/70975

USPC .......... 355/30, 53, 72–77; 250/492.1, 492.2, 250/492.21, 492.3; 414/217, 220, 221, 414/805, 939; 118/50, 50.1; 134/12, 14, 134/21; 417/44.2, 53
See application file for complete search history.

(56) References Cited

U.S. PATENT DOCUMENTS

| | | | |
|---|---|---|---|
| 4,504,194 A * | 3/1985 | Holden | C23C 14/566 137/571 |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Lee et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2005/0002003 A1* | 1/2005 | Hoogkamp | G03F 7/70741 355/30 |

(Continued)

*Primary Examiner* — Christina A Riddle
(74) *Attorney, Agent, or Firm* — McClure, Qualey & Rodack, LLP

(57) ABSTRACT

A method for creating a vacuum in a load lock chamber is provided. The method includes building an air-tight environment in the load lock chamber. The method further includes reducing the pressure in a gas tank to a predetermined vacuum pressure. The method also includes enabling an exchange of gas between the load lock chamber and the gas tank when the pressure in the gas tank is at the predetermined vacuum pressure so as to reduce the pressure in the load lock chamber to an adjusted vacuum pressure.

18 Claims, 8 Drawing Sheets

(56) References Cited

U.S. PATENT DOCUMENTS

2005/0183823 A1* 8/2005 Yonekawa .......... G03F 7/70525
156/345.31
2013/0312835 A1* 11/2013 Minshall ........... H01L 21/67011
137/12

* cited by examiner

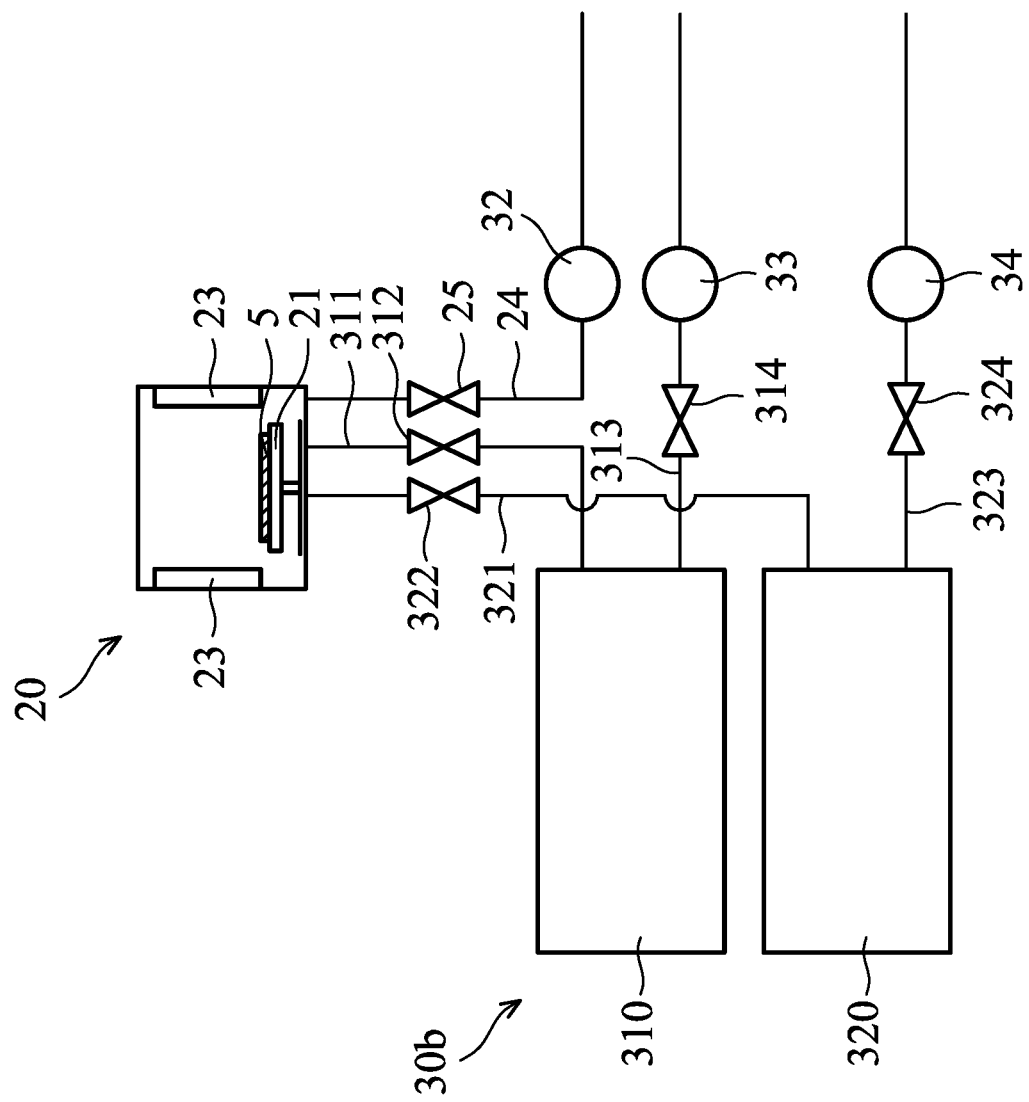

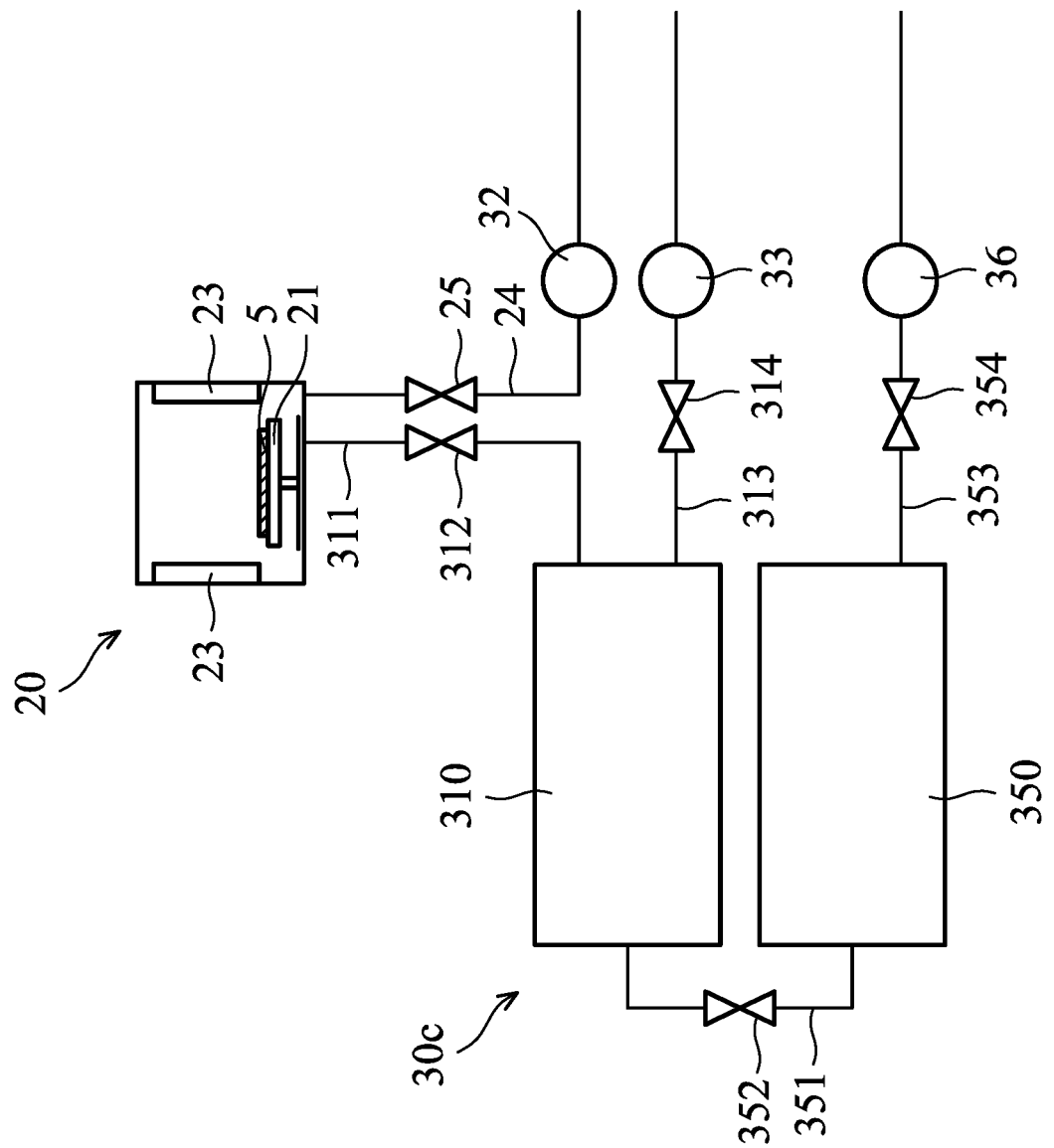

METHOD FOR CREATING VACUUM IN LOAD LOCK CHAMBER

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

For example, there is a growing need to perform higher-resolution lithography processes. One lithography technique is extreme ultraviolet lithography (EUVL). The EUVL technique employs scanners that use light in the extreme ultraviolet (EUV) region, having a wavelength of about 1-10 nm. Some EUV scanners provide 4 times reduction projection printing, similar to some optical scanners, except that the EUV scanners use reflective rather than refractive optics, i.e., mirrors instead of lenses.

EUV radiation is absorbed in virtually all transmissive materials, including gases and glasses. To minimize unwanted absorption and to avoid EUV intensity loss, EUV lithography patterning is maintained in a vacuum environment. Therefore, the semiconductor wafer stays in a load lock chamber and will not be transferred to the EUV exposure chamber until vacuum pressure is created in the load lock chamber.

Although existing methods and devices for creating the vacuum pressure in the load lock chamber have been adequate for their intended purposes, they have not been entirely satisfactory in all respects. Consequently, it would be desirable to provide a solution to more efficiently create a reduced pressure or high vacuum in a load lock chamber.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 7 shows a schematic view of a load lock chamber and a pressure adjusting module, in accordance with some embodiments.

FIG. 8 shows a schematic view of a load lock chamber and a pressure adjusting module, in accordance with some embodiments.

DETAILED DESCRIPTION

Figure 1:
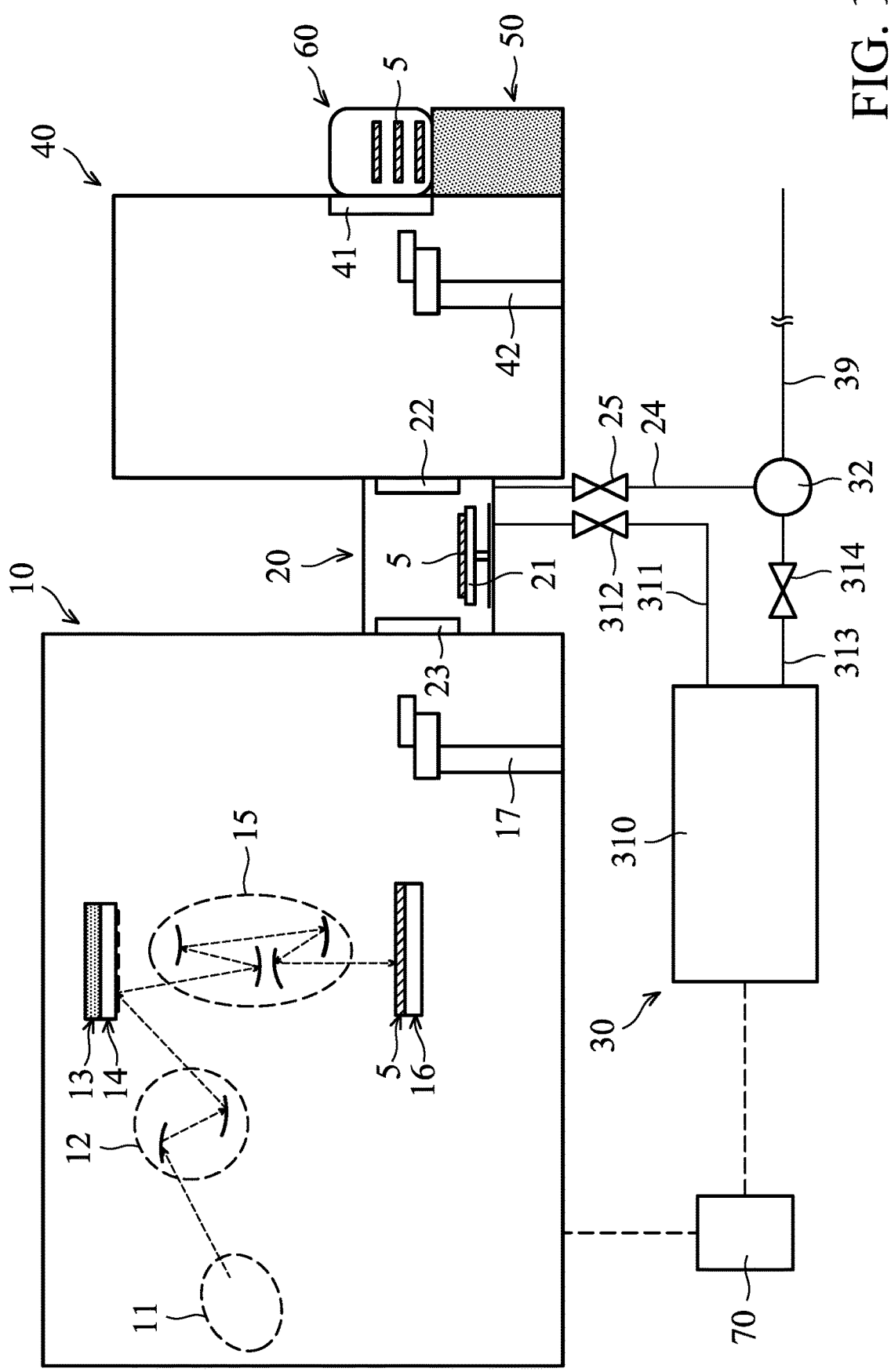
FIG. 1 shows a schematic view of a semiconductor wafer processing system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic and diagrammatic view of a semiconductor wafer processing system 1, in accordance with some embodiments. In some embodiments, the semiconductor wafer processing system 1 includes a processing apparatus 10, a load lock chamber 20, a pressure adjusting module 30, an interface module 40, one or more load ports 50, and one or more carriers 60, in accordance with some embodiments. It should be appreciated that the features described below can be replaced or eliminated in other embodiments of the semiconductor wafer processing system 1.

In some embodiments, the processing apparatus 10 is a lithography apparatus which uses a high-brightness light to expose a resist layer coated on a semiconductor wafer 5. As a result, the processing apparatus 10 may also be generically referred to as a scanner that is operable to perform lithography exposing processes with respective radiation source and exposure mode.

In some embodiments, the processing apparatus 10 includes a high-brightness light source 11, an illuminator 12, a mask stage 13, a mask 14, a projection optics module (or projection optics box (POB)) 15, a substrate stage 16, and a wafer transfer member 17, in accordance with some embodiments. The elements of the processing apparatus 10 can be added to or omitted, and the invention should not be limited by the embodiment.

The high-brightness light source 11 is configured to generate radiation having a wavelength ranging between about 1 nm and about 10 nm. In one particular example, the high-brightness light source 11 generates an EUV light with a wavelength centered at about 13.5 nm. Accordingly, the high-brightness light source 11 is also referred to as an EUV light source. However, it should be appreciated that the high-brightness light source 11 should not be limited to emitting EUV light. The high-brightness light source 11 can be utilized to perform any high-intensity photon emission from excited target material.

In various embodiments, the illuminator 12 includes various refractive optic components, such as a single lens or a lens system having multiple lenses (zone plates) or alternatively reflective optics (for EUV lithography system), such as a single mirror or a mirror system having multiple mirrors in order to direct light from the high-brightness light source 11 onto a mask stage 13, particularly to a mask 14 secured on the mask stage 13. In the present embodiment where the high-brightness light source 11 generates light in the EUV wavelength range, reflective optics is employed.

The mask stage 13 is configured to secure the mask 14. In some embodiments, the mask stage 13 includes an electrostatic chuck (e-chuck) to secure the mask 14. This is because the gas molecules absorb EUV light and the lithography system for the EUV lithography patterning is maintained in a vacuum environment to avoid EUV intensity loss. In the present disclosure, the terms mask, photomask, and reticle are used interchangeably.

In the present embodiment, the mask 14 is a reflective mask. One exemplary structure of the mask 14 includes a substrate with a suitable material, such as a low thermal expansion material (LTEM) or fused quartz. In various examples, the LTEM includes TiO2 doped SiO2, or other suitable materials with low thermal expansion. The mask 14 includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The mask 14 may further include a capping layer, such as ruthenium (Ru), disposed on the ML for protection. The mask 14 further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The projection optics module (or projection optics box (POB)) 15 is configured for imaging the pattern of the mask 14 onto a semiconductor wafer 5 secured on a substrate stage 16 of the processing apparatus 10. In some embodiments, the POB 15 has refractive optics (such as for a UV lithography system) or alternatively reflective optics (such as for an EUV lithography system) in various embodiments. The light directed from the mask 14, carrying the image of the pattern defined on the mask, is collected by the POB 15. The illuminator 12 and the POB 15 are collectively referred to as an optical module of the processing apparatus 10.

The wafer transfer member 17 is configured to deliver the semiconductor wafer 5 from one location within the processing apparatus 10 to another. For example, the semiconductor wafer 5 located in the load lock chamber 20 is transferred to the substrate stage 16 by the wafer transfer member 17. A radial and rotational movement of the wafer transfer member 17 can be coordinated or combined in order to pick up, transfer, and deliver the semiconductor wafer 5.

In the present embodiment, the semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 5 may be a silicon-on-insulator (SOI) or a germanium-on-insulator (GOI) substrate.

In addition, the semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the semiconductor wafer 5 is coated with a resist layer that is sensitive to the EUV light in the present embodiment. Various components including those described above are integrated together and are operable to perform lithography exposing processes.

It should be appreciated that while the processing apparatus 10 is a lithography module, the embodiments of the disclosure should not be limited thereto. The processing apparatus 10 may be configured to perform any manufacturing procedure on a semiconductor wafer 5. For example, the processing apparatus 10 may be configured to perform manufacturing procedures that include deposition processes such as physical vapor deposition (PVD), chemical vapor deposition (CVD), plasma-enhanced chemical vapor deposition (PECVD) and/or other deposition processes. Alternatively, the processing apparatus 10 may be configured to perform manufacturing procedures that include etching processes such as wet etching, dry etching or ion beam milling.

Also, the processing apparatus 10 may be configured to perform manufacturing procedures that include lithographic exposure, ion implantation, thermal processes, cleaning processes, testing, any procedure involved in the processing of the semiconductor wafer 5, and/or any combination of such procedures.

The load lock chamber 20 is arranged between the processing apparatus 10 and the interface module 40. The load lock chamber 20 is configured for preserving the atmosphere within the processing apparatus 10 by separating it from the interface module 40. In some embodiments, the load lock chamber 20 includes a wafer stage 21, an exterior door 22 and an interior door 23. When the semiconductor wafer 5 is inserted into the load lock chamber 20, the semiconductor wafer 5 is placed on the wafer stage 21, and the exterior door 22 and the interior door 23 are sealed. As a result, an air-tight environment is built in the load lock chamber 20.

The load lock chamber 20 is capable of creating an atmosphere compatible with the processing apparatus 10 or the interface module 40 depending on where the loaded semiconductor wafer 5 is scheduled to be next. This can be performed by altering the gas content of the load lock chamber 20 by adding gas or creating a vacuum, along with other suitable means, using such mechanisms as the pressure adjusting module 30, for adjusting atmosphere in the load lock chamber 20. When the correct atmosphere has been reached, the semiconductor wafer 5 can be accessed.

The pressure adjusting module 30 is configured to reduce the pressure of gas in the load lock chamber 20. In some embodiments, the pressure adjusting module 30 includes a gas tank 310 and a pumping assembly 32. In some embodiments, the volume of the gas tank 310 is greater than the volume of a space defined in the load lock chamber 20 for receiving the semiconductor wafer 5. In some embodiments, the volume of the gas tank 310 is about 15 to about 20 times the volume of the load lock chamber 20. As such, a pressure drop occurs in the load lock chamber 20, when a low pressure gas is contained in the gas tank 310 and an exchange of gas between the gas tank and the load lock chamber 20 is enabled.

In some embodiments, the gas tank 310 is connected to the load lock chamber 20 via the gas line 311. A valve 312 is positioned on the gas line 311 for controlling the flow of gas in the gas line 311. In addition, the gas tank 310 is connected to the pumping assembly 32 via the gas line 313. A valve 314 is positioned on the gas line 313 for controlling the flow of gas in the gas line 313. Moreover, the pumping assembly 32 is connected to the load lock chamber 20 via a gas line 24. A valve 25 is connected to the gas line 24 for controlling the flow of gas in the gas line 24.

The pumping assembly 32 may include a number of vacuum pumps with different ultimate pressure connected in series so as to improve the pumping speed of the load lock chamber 20 or the gas tank 310. For example, the pumping assembly 32 includes a primary pump connected in series to a secondary pump. The primary pump is used to lower pressure from one pressure state (typically atmospheric pressure) to a lower pressure state, and after which the secondary pump is used to evacuate the process chamber down to high-vacuum levels needed for processing. The primary pump may be a skimmer pump, a diaphragm pump, a rotary vane pump, or a scroll pump. The secondary pump may be a high-vacuum molecular pump, or a rotary pump. The gas exhausted from the pumping assembly 32 is discharged into a gas handling system (not shown) of a FAB via a gas conduit 39.

In some embodiments, the interface module 40 is a facility interface. In some embodiments, the load port 50 is adjacent to the interface module 40. In some embodiments, an overhead hoist transport (OHT) (not shown) transports the carrier 60, such as a standard mechanical interface (SMIF) or a front opening unified pod (FOUP) with the semiconductor wafer 5 from a stocker (not shown) to the load port 50.

In some embodiment, the interface module 40 includes a wafer transfer member 42 for delivering the semiconductor wafer 5 from one location within the processing interface module 40 to another. For example, when the carrier 60 is located on the load port 50, the semiconductor wafer 5 in the carrier 60 is transferred to the load lock chamber 20 by the wafer transfer member 42. A radial and rotational movement of the wafer transfer member 42 can be coordinated or combined in order to pick up, transfer, and deliver the semiconductor wafer 5.

The controller 70 is configured to control the operation of the semiconductor wafer processing system 1. In some embodiments, the controller 70 includes a computer integrated manufacturing (CIM) host and is electrically connected to all elements of the semiconductor wafer processing system 1. For example, the controller 70 is electrically connected to the pumping assembly 32, the valve 25 and the valves 312 and 314 of the pressure adjusting module 30 and controls the operation of the pumping assembly 32, the valve 25 and the valves 312 and 314 of the pressure adjusting module 30.

Figure 2:
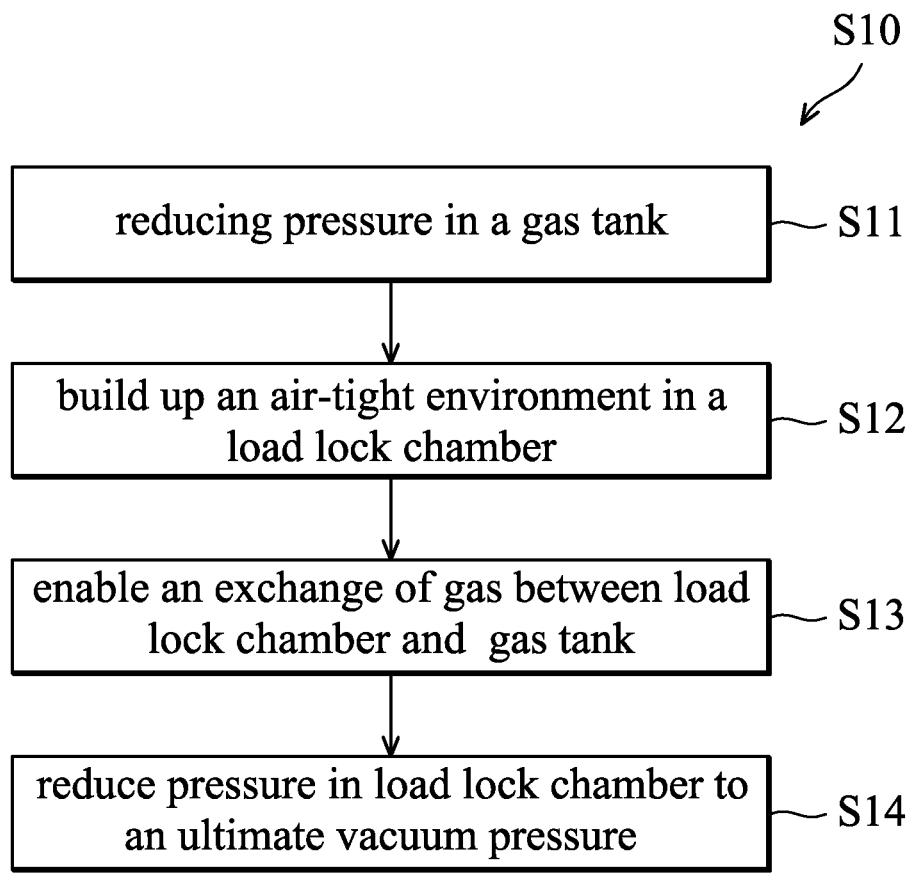
FIG. 2 is a flowchart of a method for creating a vacuum in a load lock chamber, in accordance with some embodiments.
Figure 3A:
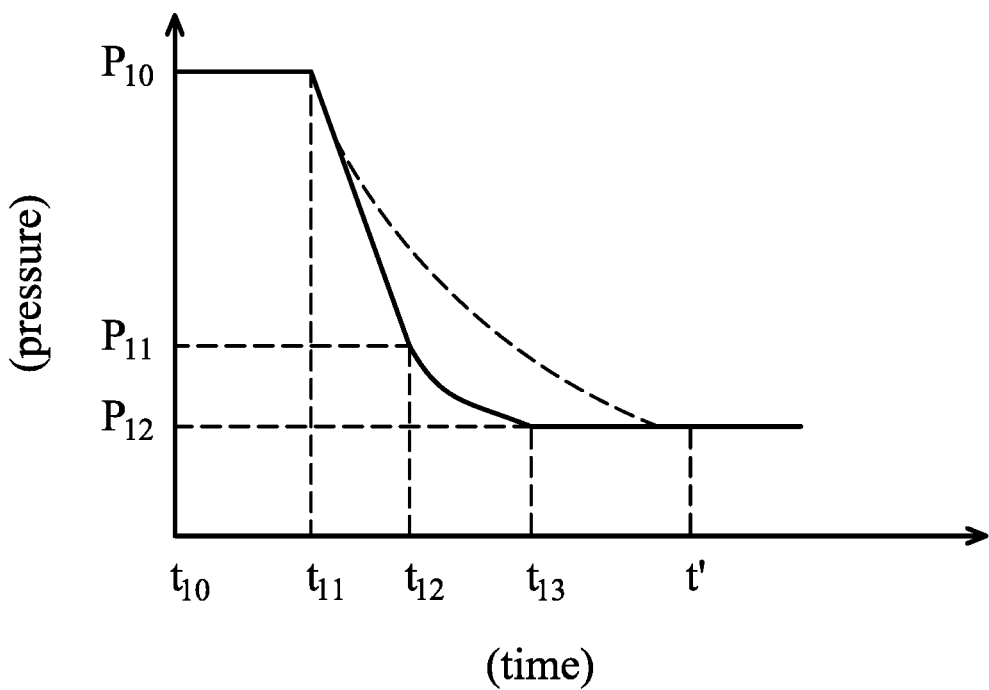
FIG. 3A is a timing chart for showing changes in the pressure of gas in a load lock chamber, in accordance with some embodiments.

FIG. 2 is a flow chart illustrating a method S10 for creating a vacuum in the load lock chamber 20, in accordance with some embodiments. FIG. 3A shows a graph of pressure in the load lock chamber 20 versus time, in accordance with some embodiments. In this figure, the pressure change under conditions in which the pressure in the load lock chamber 20 is reduced by the use of the pumping assembly 32 along with the gas tank 310 is indicated by a solid line, and the pressure change under conditions in which the pressure in the load lock chamber 20 is reduced by the use of the pumping assembly 32 only without connecting to the gas tank 310 is indicated by a dotted line. For illustration, the flow chart of FIG. 2 will be described along with the schematic views shown in FIGS. 1, 3A and 3B. Some of the stages described can be replaced or eliminated for different embodiments. Additional features can be added to the semiconductor device structure. Some of the features described below can be replaced or eliminated for different embodiments.

The method S10 includes operation S11, in which a gas tank evacuation process is performed to reduce the pressure in the gas tank 310. In some embodiments, before the gas tank evacuation process, the valve 314 is turned to an open position by the controller 70. Afterwards, the gas contained in the gas tank 310 is pumped out of the gas tank 310 by the pumping assembly 32 in the gas tank evacuation process. The gas tank evacuation process is carried out for a time period until the pressure of the gas in the gas tank is equal to a predetermined vacuum pressure $P_{15}$ (FIG. 3B).

In some embodiments, when the gas tank evacuation process is finished, the valve 314 is turned to a closed position by the controller 70. However, it should be appreciated that many variations and modifications can be made to embodiments of the disclosure. In some other embodiments, the valve 314 is kept in the open position and the gas tank evacuation process is continued even if the pressure of the gas in the gas tank 310 is equal to the predetermined vacuum pressure $P_{15}$.

The predetermined vacuum pressure $P_{15}$ is lower than pressure in load lock chamber 20. In some embodiments, the predetermined vacuum pressure $P_{15}$ is sufficiently low as to permit an abrupt pressure drop in the load lock chamber 20 after the gas tank 310 is communicated with the load lock chamber 20. In some embodiments, the predetermined vacuum pressure $P_{15}$ is substantially equal to or slightly higher than the pressure in the processing apparatus 10.

Figure 3B:
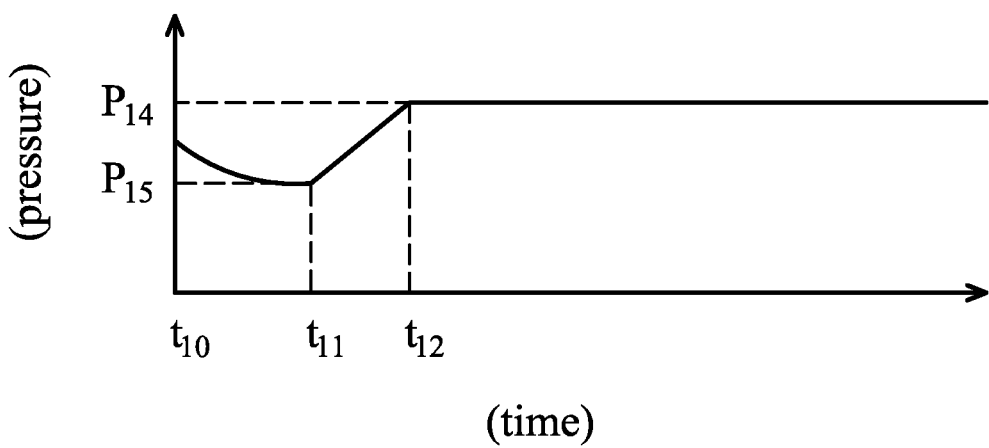
FIG. 3B is a timing chart for showing changes in the pressure of gas in a gas tank, in accordance with some embodiments.

In some embodiments, as shown in FIG. 3B, the operation S11 is completed before time $t_{11}$ when the load lock chamber 20 is sealed, and the gas at the predetermined vacuum pressure $P_{15}$ is stored in the gas tank 310. As a result, once the load lock chamber 20 is sealed, the next operation can be initiated.

The method S10 also includes operation S12, in which an air-tight environment is built up in the load lock chamber 20. In some embodiments, before the load lock chamber 20 is sealed, the semiconductor wafer 5 is inserted into the load lock chamber 20 from the interface module 40.

In order to transfer the semiconductor wafer 5 into the load lock chamber 20, the exterior door 22 is opened, and the interior door 23 is closed to isolate the load lock chamber 20 from other components of the processing apparatus 10. Afterwards, the semiconductor wafer 5 is inserted into the load lock chamber 20 through the exterior door 22 and placed on the wafer stage 21. After the semiconductor wafer 5 is placed in the load lock chamber 20, the exterior door 22 is closed to isolate the load lock chamber 20 from the interface module 40. As a result, an air-tight environment is built in the load lock chamber 20.

In some embodiments, the semiconductor wafer 5 is sent into the load lock chamber at time $t_{10}$, and the load lock chamber is closed at time $t_{11}$. As shown in FIG. 3A, in the period from time $t_{10}$ to time $t_{11}$, the pressure of gas in the load lock chamber 20 is an ambient pressure $P_{10}$. The ambient pressure $P_{10}$ may be atmospheric pressure.

The method S10 also includes operation S13, in which an exchange of gas between the load lock chamber 20 and the gas tank 310 is enabled. In some embodiments, the load lock chamber 20 is communicated with the gas tank 310 via the gas line 311 by turning the valve 312 to an open position. The valve 312 may be controlled by the controller 70 to allow the gas exchange at time $t_{11}$. Once the valve 312 is turned on, a portion of gas contained in the load lock chamber 20 is drawn out of the load lock chamber 20 and enters to the gas tank 310 because the pressure difference between the load lock chamber 20 and the gas tank 310. As a result, as shown in FIGS. 3A and 3B, a rapid reduce of the pressure in the load lock chamber 20 occurs at time $t_{11}$.

The gas exchange between the load lock chamber 20 and the gas tank 310 is not terminated until a pressure equalization of the load lock chamber 20 and the gas tank 310 is established. For example, as shown in FIG. 3A, at time $t_{12}$, the pressure in the load lock chamber 20 is reduced from the ambient pressure $P_{10}$ to the adjusted vacuum pressure $P_{11}$. While at the same time, as shown in FIG. 3B, the pressure in the gas tank 310 is increased from pressure $P_{15}$ to pressure $P_{14}$. The adjusted vacuum pressure $P_{11}$ is equal to pressure $P_{14}$ which means that pressure equalization of the load lock chamber 20 and the gas tank 310 is established. In some embodiments, once pressure equalization is established, the gas exchange between the load lock chamber 20 and the gas tank 310 is terminated by turning the valve 312 to the closed position.

The method S10 also includes operation S14, in which the pressure in the load lock chamber 20 is reduced from the adjusted vacuum pressure $P_{11}$ to an ultimate vacuum pressure $P_{12}$. In some embodiments, the controller 70 turns the valve 25 to an open position at time $t_{12}$, and gas contained in the load lock chamber 20 is drawn out of the load lock chamber 20 by the pumping assembly 32. The ultimate vacuum pressure P12 may be in a range from about 0.8 Pa to about 1.0 Pa.

The gas evacuation process of the load lock chamber 20 is terminated when the pressure in the load lock chamber 20 is equal to the ultimate vacuum pressure $P_{12}$. In some embodiments, the ultimate vacuum pressure $P_{12}$ is substantially equal to the pressure in the processing apparatus 10. Once the pressure in the load lock chamber 20 is equal to the ultimate vacuum pressure $P_{12}$, the valve 25 is turned off to maintain the vacuum pressure in the load lock chamber 20. Afterwards, the interior door 23 can be opened and the semiconductor wafer 5 can be moved to the processing apparatus 10.

However, it should be appreciated that many variations and modifications can be made to embodiments of the disclosure. In some other embodiments, the valve 25 is kept in the open position and the gas tank evacuation process is continued even if the pressure of the gas in the load lock chamber 20 is equal to the ultimate vacuum pressure $P_{12}$. In some other embodiments, operation S14 is omitted, the interior door 23 is opened and the semiconductor wafer 5 is moved to the processing apparatus 10 after operation S13 as long as the pressure in the load lock chamber 20 is lower than a threshold value.

As shown in FIG. 3B, the time needed to create the ultimate vacuum pressure $P_{12}$ in the load lock chamber 20 without a connection to the prepared vacuum in the gas tank is from time $t_{11}$ to time t'. On the other hand, with the assistance of the gas tank 310, the time needed to create the ultimate vacuum pressure $P_{12}$ in the load lock chamber 20 is from time $t_{11}$ to time $t_{13}$ which is less than the time t'. As the time required to create the vacuum in the load lock chamber 20 is reduced, the throughput of semiconductor wafer 5 per hour of the processing system 1 is increased.

Figure 4:
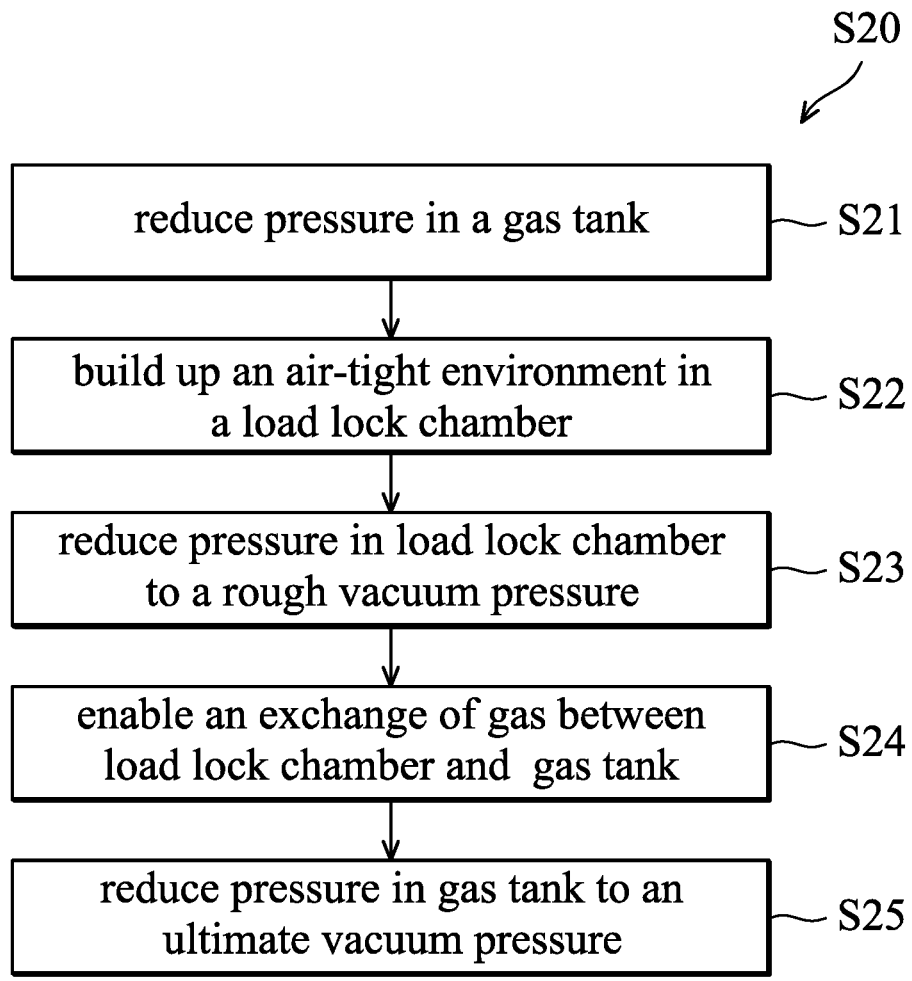
FIG. 4 is a flowchart of a method for creating a vacuum in a load lock chamber, in accordance with some embodiments.
Figure 5A:
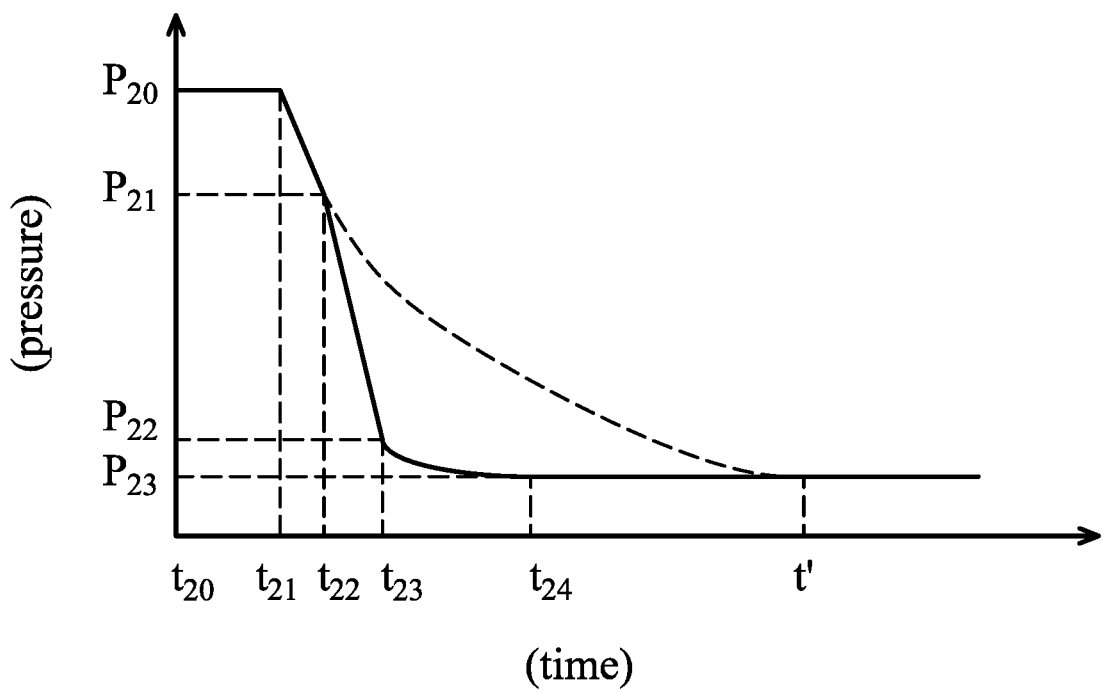
FIG. 5A is a timing chart for showing changes in the pressure of gas in a load lock chamber, in accordance with some embodiments.

FIG. 4 is a flow chart illustrating a method S20 for creating a vacuum in the load lock chamber 20, in accordance with some embodiments. FIG. 5A shows a graph of pressure in the load lock chamber 20 versus time, in accordance with some embodiments. In this figure, the pressure change under conditions in which the pressure in the load lock chamber 20 is reduced by the use of the pumping assembly 32 along with the gas tank 310 is indicated by a solid line, and the pressure change under conditions in which the pressure in the load lock chamber 20 is reduced by the use of the pumping assembly 32 only without connecting to the gas tank 310 is indicated by a dotted line. For illustration, the flow chart of FIG. 4 will be described along with the schematic views shown in FIGS. 1, 5A and 5B. Some of the stages described can be replaced or eliminated for different embodiments. Additional features can be added to the semiconductor device structure. Some of the features described below can be replaced or eliminated for different embodiments.

The method S20 also includes operation S21, in which a gas tank evacuation process is performed to reduce the pressure in the gas tank 310. In some embodiments, before the gas tank evacuation process, the valve 314 is turned to an open position by the controller 70. Afterwards, the gas contained in the gas tank 310 is pumped out of the gas tank 310 by the pumping assembly 32 in the gas tank evacuation process. The gas tank evacuation process is carried out for a time period that lasts until the pressure of the gas in the gas tank is equal to a predetermined vacuum pressure $P_{25}$ (FIG.

3B). When the gas tank evacuation process is finished, the valve 314 is turned to the closed position by the controller 70.

In some embodiments, the gas tank evacuation process is stopped no later than time $t_{21}$ so that the pumping assembly 32 can be used to evacuate the gas in the load lock chamber 20 after time $t_{21}$. In some embodiments, the gas tank evacuation process is stopped as operation S24 (which will be described later) is initiated. Because the volume of the gas tank is relatively large, the gas tank evacuation process may be initiated before $t_{20}$ at which the semiconductor wafer 5 is transmitted to the load lock chamber 20.

The method S20 includes operation S22, in which an air-tight environment is built in the load lock chamber 20. In some embodiments, before the load lock chamber 20 is sealed, the semiconductor wafer 5 is inserted into the load lock chamber 20 from the interface module 40.

In order to transfer the semiconductor wafer 5 into the load lock chamber 20, the exterior door 22 is opened, and the interior door 23 is closed to isolate the load lock chamber 20 from other components of the processing apparatus 10. Afterwards, the semiconductor wafer 5 is inserted into the load lock chamber 20 through the exterior door 22 and placed on the wafer stage 21. After the semiconductor wafer 5 is inserted within the load lock chamber 20, the exterior door 22 is closed to isolate the load lock chamber 20 from the interface module 40. As a result, an air-tight environment is built in the load lock chamber 20.

In some embodiments, the semiconductor wafer 5 is sent into the load lock chamber at time $t_{20}$, and the load lock chamber is closed at time $t_{21}$. As shown in FIG. 5A, in the period from time $t_{20}$ to time $t_{21}$, the pressure of gas in the load lock chamber 20 is an ambient pressure $P_{20}$. The ambient pressure $P_{20}$ may be atmospheric pressure.

The method S20 also includes operation S23, in which a first chamber evacuation process is performed to reduce the pressure in the load lock chamber 20. In some embodiments, before the gas tank evacuation process, the valve 25 is turned to the open position by the controller 70. Afterwards, the gas contained in the load lock chamber 20 is pumped out of the load lock chamber 20 by the pumping assembly 32 in the first chamber evacuation process. The first chamber evacuation process is carried out for a time period until the pressure of the gas in the gas tank is reduced from an ambient pressure $P_{20}$ to a rough vacuum pressure $P_{21}$. When the first chamber evacuation process is finished, the valve 25 is kept in the open position.

In some embodiments, the predetermined vacuum pressure $P_{25}$ (FIG. 5B) is lower than the rough vacuum pressure $P_{21}$ (FIG. 5A). In some embodiments, the predetermined vacuum pressure $P_{25}$ is sufficiently low as to permit an abrupt pressure drop in the load lock chamber 20 after the gas tank 310 is communicated with the load lock chamber 20. In some embodiments, the predetermined vacuum pressure $P_{25}$ is substantially equal to the pressure in the processing apparatus 10. The predetermined vacuum pressure P25 may be less than about 0.5 Pa.

The method S20 also includes operation S24, in which an exchange of gas between the load lock chamber 20 and the gas tank 310 is enabled. In some embodiments, the load lock chamber 20 is communicated with the gas tank 310 via the gas line 311 by turning the valve 312 to an open position. The valve 312 may be controlled by the controller 70 to allow the gas exchange at time $t_{22}$. Once the valve 312 is turned on, a portion of gas contained in the load lock chamber 20 is drawn out of the load lock chamber 20 and enters to the gas tank 310 because of the pressure difference between the load lock chamber 20 and the gas tank 310. As a result, a pressure drop occurs in the load lock chamber 20.

Figure 5B:
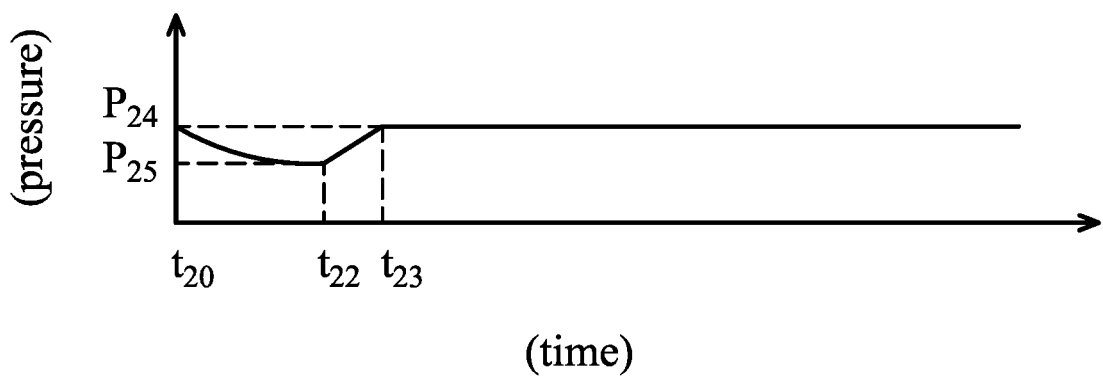
FIG. 5B is a timing chart for showing changes in the pressure of gas in a gas tank, in accordance with some embodiments.

The gas exchange between the load lock chamber 20 and the gas tank 310 is not terminated until pressure equalization of the load lock chamber 20 and the gas tank 310 is established. For example, as shown in FIG. 5A, at time $t_{23}$, the pressure in the load lock chamber 20 is reduced from the rough vacuum pressure $P_{21}$ to the adjusted vacuum pressure $P_{22}$. While at the same time, as shown in FIG. 5B, the pressure in the gas tank 310 is increased from the pressure $P_{25}$ to a pressure $P_{24}$. The adjusted vacuum pressure $P_{22}$ is equal to the pressure $P_{24}$ which means pressure equalization of the load lock chamber 20 and the gas tank 310 has been established. In some embodiments, once the pressure equalization is built, the gas exchange between the load lock chamber 20 and the gas tank 310 is terminated by turning the valve 312 to a closed position.

The method S20 also includes operation S25, in which a second chamber evacuation process is performed to reduce the pressure in the load lock chamber 20. In some embodiments, the gas contained in the load lock chamber 20 is pumped out of the load lock chamber 20 by the pumping assembly 32 in the second chamber evacuation process. The second chamber evacuation process is carried out for a time period until the pressure of the gas in the gas tank is reduced from the adjusted vacuum pressure P22 to an ultimate vacuum pressure P23. When the second chamber evacuation process is finished, the valve 25 is kept in the open position.

In some embodiments, the operation S23 and the operation S25 are performed consecutively, and operation S24 is initiated after the end of the operation S23. As a result, a portion of a processing time of operation S25 is overlapped with the processing time of operation S24. Namely, during the gas exchange between the load lock chamber 20 and the gas tank 310 the gas in the load lock chamber 20 is continuously pumped out from the load lock chamber 20 by the pumping assembly 32.

In some embodiments, the ultimate vacuum pressure $P_{23}$ is substantially equal to the pressure in the processing apparatus 10. Once the pressure in the load lock chamber 20 is equal to the ultimate vacuum pressure $P_{23}$, the valve 25 is turned off to maintain the vacuum pressure in the load lock chamber 20. Afterwards, the interior door 23 can be opened and the semiconductor wafer 5 can be moved to the processing apparatus 10.

However, it should be appreciated that many variations and modifications can be made to embodiments of the disclosure. In some other embodiments, the valve 25 is kept in the open position and the gas tank evacuation process is continued even if the pressure of the gas in the load lock chamber 20 is equal to the ultimate vacuum pressure $P_{23}$. In some other embodiments, operation S25 is omitted, the interior door 23 is opened and the semiconductor wafer 5 is moved to the processing apparatus 10 after operation S24 as long as the pressure in the load lock chamber 20 is lower than a threshold value.

As shown in FIG. 5A, the time needed to create the ultimate vacuum pressure $P_{23}$ in the load lock chamber 20 without a connection to the prepared vacuum in the gas tank 310 is from time $t_{21}$ to time t'. On the other hand, with the assistance of the gas tank 310, the time needed to create the ultimate vacuum pressure $P_{23}$ in the load lock chamber 20 is from time $t_{21}$ to time $t_{24}$ which is less than the time t'. As the time required to create the vacuum in the load lock chamber 20 is reduced, the throughput of semiconductor wafer 5 per hour of the processing system 1 is increased.

Figure 6:
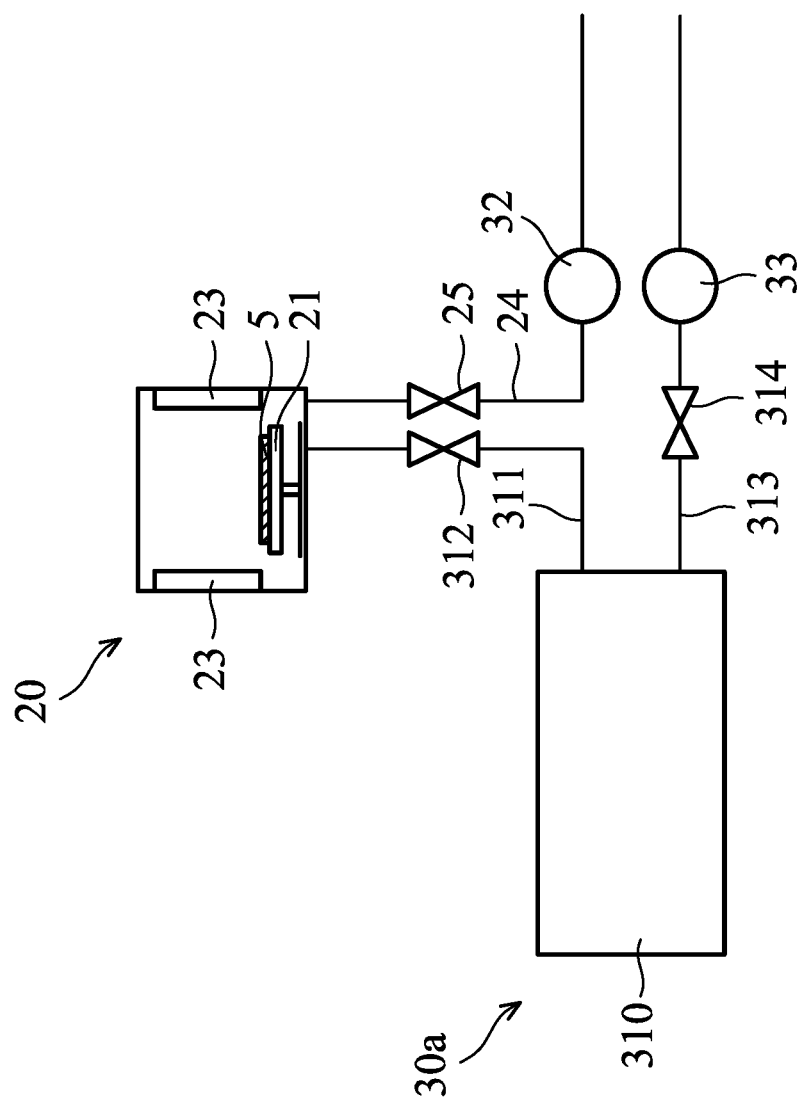
FIG. 6 shows a schematic view of a load lock chamber and a pressure adjusting module, in accordance with some embodiments.

FIG. 6 shows a schematic view of a load lock chamber 20 and a pressure adjusting module 30a. In the embodiment, elements that are identical with or similar to the elements of the load lock chamber 20 and the pressure adjusting module 30 shown in FIG. 1 are designated by the same reference numbers, and the features thereof are not repeated for the purpose of brevity. The differences between the pressure adjusting module 30a and the pressure adjusting module 30 include the pressure adjusting module 30 further including a pumping assembly 33.

The pumping assembly 33 is connected to the gas tank 310 via the gas line 313. The pumping assembly 33 is used to regulate the pressure of gas tank 310 in operation S11 in FIG. 2 and operation S21 in FIG. 4. In some embodiments, the ultimate pressure of the pumping assembly 33 is lower than the ultimate pressure of the second pumping assembly 32. The ultimate pressure is the lowest pressure that is asymptotically approached by the pressure of a pump under defined conditions without gas inlet. In some embodiments, since the pressure in the gas tank 310 and the pressure in the load lock chamber 20 are regulated independently, in the method S20, operation S21 and operation S23 can be performed simultaneously.

FIG. 7 shows a schematic view of a load lock chamber 20 and a pressure adjusting module 30b. In the embodiment, elements that are identical with or similar to the elements of the load lock chamber 20 and the pressure adjusting module 30a shown in FIG. 6 are designated by the same reference numbers, and the features thereof are not repeated for the purpose of brevity. The differences between the pressure adjusting module 30b and the pressure adjusting module 30a include the pressure adjusting module 30b further including a gas tank 320 and a pumping assembly 34.

The gas tank 320 is connected to the load lock chamber 20 via a gas line 321. A valve 322 is positioned on the gas line 321 for controlling the flow of gas in the gas line 321. In addition, the gas tank 320 is connected to the pumping assembly 34 via a gas line 323. A valve 324 is positioned on the gas line 323 for controlling the flow of gas in the gas line 323. The pumping assembly 34 may include a number of vacuum pumps with different ultimate pressure connected in series so as to improve the pumping speed of the gas tank 320. The gas tank 320 may be the same size as the gas tank 310.

In some embodiments, the gas tank 310 and the gas tank 320 are alternately connected to the load lock chamber 25 in two sequential wafer processes. As a result, operation S13 in FIG. 2 and operation S24 in FIG. 4 can be performed when another semiconductor wafer 5 which is going to be processed is transmitted into the load lock chamber 20, even if the pressure in the gas tank 310 has not fallen to the predetermined vacuum pressure.

In some embodiments, the gas tank 310 and the gas tank 320 are connected to the load lock chamber 20 simultaneously so as to improve the vacuum efficiency of the load lock chamber 20 in operation S13 in FIG. 2 and operation S24 in FIG. 4. Compared with embodiments utilizing a gas tank which is 2 times the size of gas tank 310 or gas tank 320, the power consumption is decreased to reduce the pressure in the gas tank to the predetermined pressure.

FIG. 8 shows a schematic view of a load lock chamber 20 and a pressure adjusting module 30c. In the embodiment, elements that are identical with or similar to the elements of the load lock chamber 20 and the pressure adjusting module 30a shown in FIG. 6 are designated by the same reference numbers, and the features thereof are not repeated for the purpose of brevity. The differences between the pressure adjusting module 30c and the pressure adjusting module 30a include the pressure adjusting module 30c further including a gas tank 350 and a pumping assembly 36.

The gas tank 350 is connected to the gas tank 310 via a gas line 351. A valve 352 is positioned on the gas line 351 for controlling the flow of gas in the gas line 351. In addition, the gas tank 350 is connected to the pumping assembly 36 via a gas line 353. A valve 354 is positioned on the gas line 353 for controlling the flow of gas in the gas line 353. The pumping assembly 36 may include a number of vacuum pumps with different ultimate pressure connected in series so as to improve the pumping speed of the gas tank 350.

In some embodiments, the gas tank 350 is reduced to a high vacuum pressure by the pumping assembly 36. The high vacuum pressure is lower than the predetermined pressure $P_{15}$ or $P_{25}$ in operation S11 or S21. During operation S11 or S21, the gas tank 350 is connected to the gas tank 310 to improve the vacuum efficiency of the gas tank 310 or allow a higher vacuum to be established in the gas tank 310.

Embodiments of a method for creating a vacuum in a load lock chamber of a semiconductor wafer processing system are provided. By connecting the load lock chamber to a gas tank which contains gas having a lower pressure, the time needed for the load lock chamber to create a desired vacuum is reduced. Therefore, throughput of the semiconductor wafer processing system is improved.

In accordance with some embodiments, a method for creating a vacuum in a load lock chamber is provided. The method includes building up an air-tight environment in the load lock chamber. The method further includes reducing the pressure in a gas tank to a predetermined vacuum pressure. The method also includes enabling an exchange of gas between the load lock chamber and the gas tank when the pressure in the gas tank is at the predetermined vacuum pressure so as to reduce the pressure in the load lock chamber to an adjusted vacuum pressure.

In accordance with some embodiments, a method for creating a vacuum in a load lock chamber is provided. The method includes building up an air-tight environment in the load lock chamber. The method further includes storing a gas at a predetermined vacuum pressure in a gas tank. The method also includes reducing the pressure in the load lock chamber to an ultimate vacuum pressure. In addition, the method includes enabling an exchange of gas between the load lock chamber and a gas tank before the ultimate vacuum pressure in the load lock chamber is created. The predetermined vacuum pressure is lower than the pressure in the load lock chamber at the time the load lock chamber is communicated with the gas tank.

In accordance with some embodiments, a semiconductor wafer processing system is provided. The semiconductor wafer processing system includes a processing apparatus. The semiconductor wafer processing system further includes a load lock chamber connected to the processing apparatus. The semiconductor wafer processing system also includes a pressure adjusting module connected to the load lock chamber. The pressure adjusting module includes a gas tank connected to the load lock chamber. The pressure adjusting module further includes a first pumping assembly connected to the gas tank. The pressure adjusting module also includes a controller configured to drive the first pumping assembly to reduce the pressure in the gas tank.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for creating a vacuum in a load lock chamber, comprising:
building up an air-tight environment in the load lock chamber at a point of time;
reducing pressure in a gas tank to a predetermined vacuum pressure before the point of time;
enabling an exchange of gas between the load lock chamber and the gas tank at the point of time so as to reduce pressure in the load lock chamber to an adjusted vacuum pressure;
terminating the gas exchange between the load lock chamber and the gas tank when the pressure in the load lock chamber is reduced to the adjusted vacuum pressure;
maintaining pressure in the gas tank as the same as the adjusted vacuum pressure after terminating the exchange of gas until a semiconductor wafer is transmitted to the load lock chamber;
reducing the pressure in the load lock chamber from the adjusted vacuum pressure to an ultimate vacuum pressure after the exchange of gas between the load lock chamber and the gas tank is terminated; and
placing the load lock chamber in communication with a processing apparatus when the pressure in the load lock chamber is reduced to the ultimate vacuum pressure, and the ultimate vacuum pressure is substantially equal to the pressure in the processing apparatus.

2. The method as claimed in claim 1, wherein the pressure in the gas tank and the pressure in the load lock chamber are regulated by a single pumping assembly.

3. The method as claimed in claim 1, wherein the predetermined vacuum pressure is lower than a rough vacuum pressure.

4. The method as claimed in claim 1, wherein a volume of the gas tank is greater than a volume of the load lock chamber.

5. A method for creating a vacuum in a load lock chamber, comprising:
building up an air-tight environment in the load lock chamber;
storing a gas at a predetermined vacuum pressure in a gas tank;
reducing the pressure in the load lock chamber to an ultimate vacuum pressure;
enabling an exchange of gas between the load lock chamber and the gas tank and terminating the exchange of gas before the ultimate vacuum pressure in the load lock chamber is created, wherein at the time the load lock chamber is communicated with the gas tank, the predetermined vacuum pressure is lower than the pressure in the load lock chamber;
communicating the load lock chamber with a processing apparatus when the load lock chamber is at the ultimate vacuum pressure; and
maintaining a pressure in the gas tank after terminating the exchange of gas until a semiconductor wafer is transmitted to the load lock chamber, wherein the pressure in the gas tank is greater than the predetermined vacuum pressure.

6. The method as claimed in claim 5, wherein the pressure in the gas tank and the pressure in the load lock chamber are regulated by a single pumping assembly.

7. The method as claimed in claim 5, wherein the pressure in the gas tank is regulated by a first pumping assembly, and the pressure in the load lock chamber is regulated by a second pumping assembly, wherein the second pumping assembly is different from the first pumping assembly.

8. The method as claimed in claim 5, wherein before the enablement of the gas exchange between the load lock chamber and the gas tank, the pressure in the load lock chamber is reduced from an ambient pressure to a rough vacuum pressure.

9. The method as claimed in claim 8, wherein at the time the load lock chamber is communicated with the gas tank, the predetermined vacuum pressure is lower than the rough vacuum pressure.

10. The method as claimed in claim 5, wherein the exchange of gas between the load lock chamber and the gas tank and terminating the exchange of gas is terminated when a pressure equalization of the load lock chamber and the gas tank has been established.

11. The method as claimed in claim 5, wherein the pressure in the load lock chamber is continuously reduced with a pumping assembly before, during, and after the enablement of the exchange of gas between the load lock chamber and the gas tank.

12. A semiconductor wafer processing system, comprising:
a processing apparatus;
a load lock chamber connected to the processing apparatus; and
a pressure adjusting module connected to the load lock chamber and comprising:
a gas tank connected to the load lock chamber;
a pumping assembly connected to the gas tank and the load lock chamber; and
a controller configured to drive the pumping assembly to reduce the pressure in the load lock chamber to an ultimate vacuum pressure after terminating an exchange of gas between the load lock chamber and the gas tank, wherein the pressure in the gas tank is maintained substantially at a value when the exchange of gas is just terminated until a semiconductor wafer is transmitted to the load lock chamber.

13. The semiconductor wafer processing system as claimed in claim 12, wherein the pumping assembly further comprises a first pumping assembly connected to the gas tank and a second pumping assembly connected to the load lock chamber, the controller is configured to drive the first pumping assembly to reduce the pressure in the gas tank, and to drive the second pumping assembly to reduce the pressure in the load lock chamber.

14. The semiconductor wafer processing system as claimed in claim 13, wherein an ultimate pressure of the first pumping assembly is lower than an ultimate pressure of the second pumping assembly.

15. The semiconductor wafer processing system as claimed in claim 12, wherein a volume of the gas tank is greater than a volume of the load lock chamber.

16. The semiconductor wafer processing system as claimed in claim 12, wherein the load lock chamber is in communication with the gas tank and the pumping assembly at the same time.

17. The semiconductor wafer processing system as claimed in claim 12, further comprising another gas tank connected to the load lock chamber, wherein the gas tank and the another gas tank are connected to the load lock chamber simultaneously.

18. The semiconductor wafer processing system as claimed in claim 12, further comprising another gas tank connected to the gas tank, wherein before the pressure in the gas tank is reduced to a predetermined pressure, the pressure in the another gas tank is reduced to a high vacuum pressure, and the high vacuum pressure is lower than the predetermined pressure.

* * * * *